United States Patent
Wu

(10) Patent No.: US 9,118,291 B2
(45) Date of Patent: Aug. 25, 2015

(54) VOLTAGE SUPPLY CIRCUIT, AUDIO OUTPUT APPARATUS, AND VOLTAGE SUPPLYING METHOD

(71) Applicant: Wistron Corporation, New Taipei (TW)

(72) Inventor: Wei-Lun Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 301 days.

(21) Appl. No.: 13/787,831

(22) Filed: Mar. 7, 2013

(65) Prior Publication Data
US 2014/0072144 A1   Mar. 13, 2014

(30) Foreign Application Priority Data
Sep. 13, 2012   (TW) .............................. 101133541 A

(51) Int. Cl.
H03G 3/32 (2006.01)
H03G 3/20 (2006.01)
H03F 1/02 (2006.01)
H03G 3/00 (2006.01)
H03G 3/30 (2006.01)
H03F 3/21 (2006.01)

(52) U.S. Cl.
CPC .............. *H03G 3/20* (2013.01); *H03F 1/0244* (2013.01); *H03F 3/21* (2013.01); *H03G 3/004* (2013.01); *H03G 3/3005* (2013.01)

(58) Field of Classification Search
USPC ......................................................... 381/107
See application file for complete search history.

(56) References Cited

U.S. PATENT DOCUMENTS

| | | | | |
|---|---|---|---|---|
| 5,703,584 A | * | 12/1997 | Hill | 341/141 |
| 6,014,060 A | * | 1/2000 | Nojiri | 330/297 |
| 2008/0044041 A1 | * | 2/2008 | Tucker et al. | 381/120 |

* cited by examiner

*Primary Examiner* — Quynh Nguyen
(74) *Attorney, Agent, or Firm* — Jianq Chyun IP Office

(57) ABSTRACT

A voltage supply circuit is provided. The voltage supply circuit includes a voltage amplifier and a power selecting circuit. A power terminal of the voltage amplifier receives an operation power and outputs a gain voltage for driving an output device. The power selecting circuit receives a plurality of supply voltages and supplies one of the supply voltages to the power terminal of the voltage amplifier as the operation power according to a volume level of an audio signal. An audio output apparatus and a voltage supplying method thereof are also provided. The audio output apparatus includes the voltage supply circuit and a speaker.

15 Claims, 3 Drawing Sheets

VOLTAGE SUPPLY CIRCUIT, AUDIO OUTPUT APPARATUS, AND VOLTAGE SUPPLYING METHOD

CROSS-REFERENCE TO RELATED APPLICATION

This application claims the priority benefit of Taiwan application serial no. 101133541, filed on Sep. 13, 2012. The entirety of the above-mentioned patent application is hereby incorporated by reference herein and made a part of this specification.

BACKGROUND OF THE DISCLOSURE

1. Field of the Disclosure

The disclosure generally relates to a voltage supply circuit, and more particularly, to a voltage supply circuit capable of selectively supplying different supply voltages.

2. Description of Related Art

Along with the development of communication and network technologies, telephone devices have been made capable of transmitting audio data (and accordingly making phone calls) through the Internet. When a user makes a phone call by using an IP (Voice over Internet Protocol) phone, the IP phone digitizes and compresses the audio data and then transmits the processed data to a target device through the Internet. The target device decompresses and restores the received audio data and passes it to the other party of the conversation. Many IP phones have been developed since they require no conventional cable network for transmitting data, offer high security level, and are suitable for long-distance communications.

When an IP phone is designed, a voltage amplifier is usually adopted for driving the speaker, and the voltage amplifier requires an external voltage source to work properly. When a user adjusts the volume of the IP phone, the power consumed by the voltage amplifier changes accordingly. However, if the external voltage source remains unchanged, unnecessary power consumption may be caused in the IP phone when the volume is changed. Thereby, how to adjust the voltage supply of a voltage amplifier according to the volume level of an IP phone is one of the subjects to be resolved in the field.

SUMMARY OF THE DISCLOSURE

Accordingly, the disclosure is directed to a voltage supply circuit which can selectively supply different supply voltages according to the volume level of an audio signal.

The disclosure provides a voltage supply circuit including a voltage amplifier and a power selecting circuit. A power terminal of the voltage amplifier receives an operation power and outputs a gain voltage for driving an output device. The power selecting circuit receives a plurality of supply voltages and supplies one of the supply voltages to the power terminal of the voltage amplifier as the operation power according to the volume level of an audio signal.

According to an embodiment of the disclosure, the power selecting circuit sets a plurality of volume groups, and the power selecting circuit supplies the operation power to the voltage amplifier according to one of the volume groups corresponding to the volume level of the audio signal.

According to an embodiment of the disclosure, the voltage supply circuit further includes a volume detecting circuit and an analog multiplexer. The volume detecting circuit outputs a control signal to the analog multiplexer according to the volume level of the audio signal. The analog multiplexer is coupled to the supply voltages and the volume detecting circuit. The analog multiplexer receives the control signal from the volume detecting circuit and supplies one of the supply voltages to the voltage amplifier according to the control signal.

According to an embodiment of the disclosure, when the control signal is at a first voltage level, the analog multiplexer selects a first supply voltage among the supply voltages and supplies the first supply voltage to the power terminal of the voltage amplifier, and when the control signal is at a second voltage level, the analog multiplexer selects a second supply voltage among the supply voltages which is different from the first supply voltage and supplies the second supply voltage to the power terminal of the voltage amplifier.

According to an embodiment of the disclosure, the analog multiplexer includes a plurality of switches. The first terminals of the switches are respectively coupled to the supply voltages, the second terminals of the switches are coupled to the power terminal of the voltage amplifier, and the control terminals of the switches respectively turn on or off the switches according to the volume level of the audio signal, so as to allow the analog multiplexer to supply one of the supply voltages to the power terminal of the voltage amplifier.

According to an embodiment of the disclosure, the supply voltages include a first supply voltage and a second supply voltage, and the first supply voltage is greater than the second supply voltage. The analog multiplexer includes a first switch, a second switch, a third switch, and a first resistor. The first terminal of the first switch is coupled to the first supply voltage, and the second terminal of the first switch is coupled to the ground. The control terminal of the second switch is coupled to the first terminal of the first switch, the first terminal of the second switch is coupled to the first supply voltage, and the second terminal of the second switch is coupled to the power terminal of the voltage amplifier. The first terminal of the third switch is coupled to the second supply voltage, and the second terminal of the third switch is coupled to the power terminal of the voltage amplifier. The first resistor is coupled among the first supply voltage, the first terminal of the first switch, and the control terminal of the second switch. The control terminals of the first switch and the third switch respectively turn on or off the first switch and the third switch according to the volume level of the audio signal, so as to allow the analog multiplexer to selectively supply the first supply voltage or the second supply voltage to the power terminal of the voltage amplifier.

According to an embodiment of the disclosure, the first switch is an N-type transistor, and the second switch and the third switch are P-type transistors.

According to an embodiment of the disclosure, the output device is a speaker.

The disclosure provides an audio output apparatus including a voltage supply circuit and a speaker. The voltage supply circuit includes a voltage amplifier and a power selecting circuit. The voltage amplifier has a power terminal for receiving an operation power and outputting a gain voltage. The power selecting circuit receives a plurality of supply voltages and supplies one of the supply voltages to the power terminal of the voltage amplifier as the operation power according to the volume level of an audio signal. The speaker coupled to the voltage amplifier receives the gain voltage and outputs the audio signal.

The disclosure provides a voltage supplying method of an output device. The voltage supplying method includes following steps. The volume level of an audio signal is detected, and one of a plurality of supply voltages is selected according to the volume level of the audio signal. The selected supply voltage is supplied to a power terminal of a voltage amplifier as an operation power. A gain voltage is output to the output device to drive the output device to output the audio signal.

As described above, a voltage supply circuit selects one of a plurality of supply voltages through a power selecting circuit according to the volume level of an audio signal and supplies the selected supply voltage to a voltage amplifier. The power selecting circuit sets a plurality of volume groups. Herein each volume group is corresponding to a supply voltage. The power selecting circuit supplies an operation power to the voltage amplifier according to the volume group corresponding to the volume level of the audio signal. In addition, the volume detecting circuit converts the volume level of the audio signal into a control signal, and the power selecting circuit supplies the corresponding supply voltage to the power terminal of the voltage amplifier according to the control signal. The operations described above allow the voltage amplifier to dynamically adjust the received supply voltage, so that the power consumption is reduced. Moreover, because the power selecting circuit selects the supply voltage according to the volume level of the audio signal, aforementioned dynamical adjustment won't affect the quality of the audio signal amplified by the voltage amplifier due to insufficient supply voltage.

These and other exemplary embodiments, features, aspects, and advantages of the disclosure will be described and become more apparent from the detailed description of exemplary embodiments when read in conjunction with accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
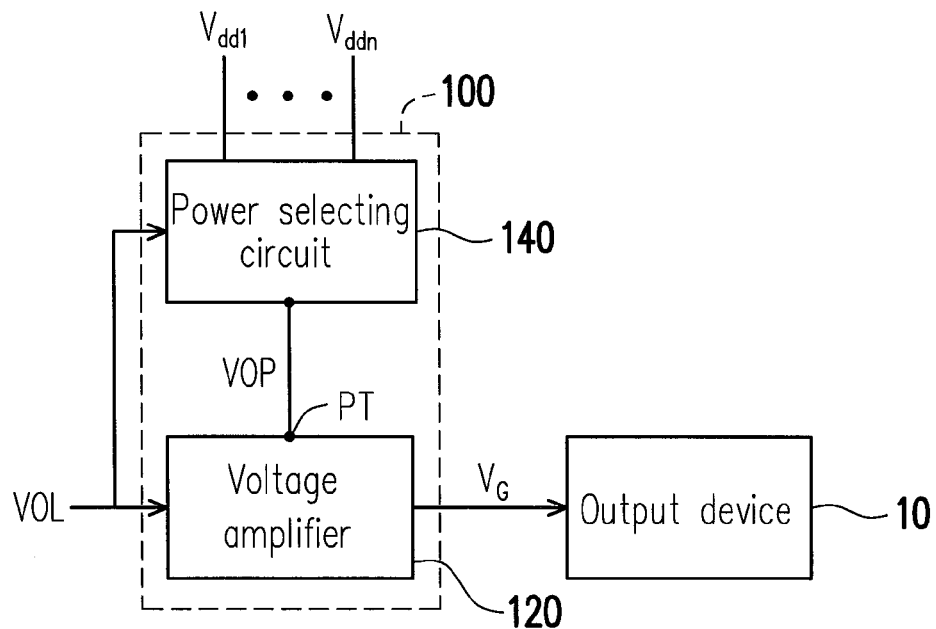
FIG. 1A is a diagram illustrating the operation of a voltage supply circuit 100 according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A is a diagram illustrating the operation of a voltage supply circuit 100 according to an embodiment of the disclosure. Referring to FIG. 1A, the voltage supply circuit 100 includes a voltage amplifier 120 and a power selecting circuit 140. The voltage amplifier 120 has a power terminal PT. The voltage amplifier 120 outputs a gain voltage $V_G$ to drive an output device 10. In the present embodiment, the voltage amplifier 120 may be implemented by using an OP amplifier, and which outputs the gain voltage $V_G$ for driving the output device 10.

In the present embodiment, the voltage amplifier 120 has the power terminal PT and receives an operating voltage VOP through the power terminal PT in order to work properly. The operating voltage VOP is supplied by the power selecting circuit 140 as an operation power. The power selecting circuit 140 is coupled to the power terminal PT and receives a plurality of supply voltages Vdd1-Vddn. Both the power selecting circuit 140 and the voltage amplifier 120 receive an audio signal VOL. The power selecting circuit 140 detects the volume level of the audio signal VOL and transmits one of the supply voltages Vdd1-Vddn to the power terminal PT of the voltage amplifier 120 as the operating voltage VOP (operation power) of the voltage amplifier 120 according to the detected volume level of the audio signal VOL. The voltage amplifier 120 works with the operating voltage VOP and outputs the gain voltage $V_G$ according to the audio signal VOL. The output device 10 may be a speaker, and which produces a sound according to the audio signal VOL.

When the power selecting circuit 140 detects the volume level of the audio signal VOL, it can detect the number of decibels (dB) in the volume of the audio signal VOL. Besides, in the present embodiment, regarding the possible range of the volume level of the audio signal VOL, the power selecting circuit 140 sets a plurality of volume groups in advance. The number of these volume groups is equal to the number of the supply voltages Vdd1-Vddn, and the volume groups are respectively corresponding to the supply voltages Vdd1-Vddn. After the power selecting circuit 140 detects the volume level of the audio signal VOL, it transmits one of the supply voltages Vdd1-Vddn to the power terminal PT of the voltage amplifier 120 according to the volume group corresponding to the volume level of the audio signal VOL.

For example, the supply voltages Vdd1-Vdd3 are sequentially the supply voltage Vdd1, the supply voltage Vdd2, and the supply voltage Vdd3 in the order of the voltage levels thereof. If, for example, the possible range of the volume level of the audio signal VOL is between 0 dB and 30 dB, the power selecting circuit 140 sets 0 dB to 10 dB as a first volume group, 10 dB to 20 dB as a second volume group, and 20 dB to 30 dB as a third volume group. Herein the first volume group is corresponding to the supply voltage Vdd3, the second volume group is corresponding to the supply voltage Vdd2, and the third volume group is corresponding to the supply voltage Vdd1.

For example, when the power selecting circuit 140 detects that the volume level of the audio signal VOL is 15 dB, because 15 dB is within the range defined by the second volume group, the power selecting circuit 140 outputs the supply voltage Vdd2 corresponding to the second volume group as the operating voltage VOP of the voltage amplifier 120.

For example, when the power selecting circuit 140 detects that the volume level of the audio signal VOL changes to 21 dB, because 21 dB is within the range defined by the third volume group, the power selecting circuit 140 outputs the supply voltage Vdd1 corresponding to the third volume group as the operating voltage VOP of the voltage amplifier 120.

Thereby, the operating voltage VOP of the voltage amplifier 120 can be dynamically adjusted in response to the volume level of the audio signal VOL. Accordingly, the power consumption can be effectively reduced.

Figure 1B:
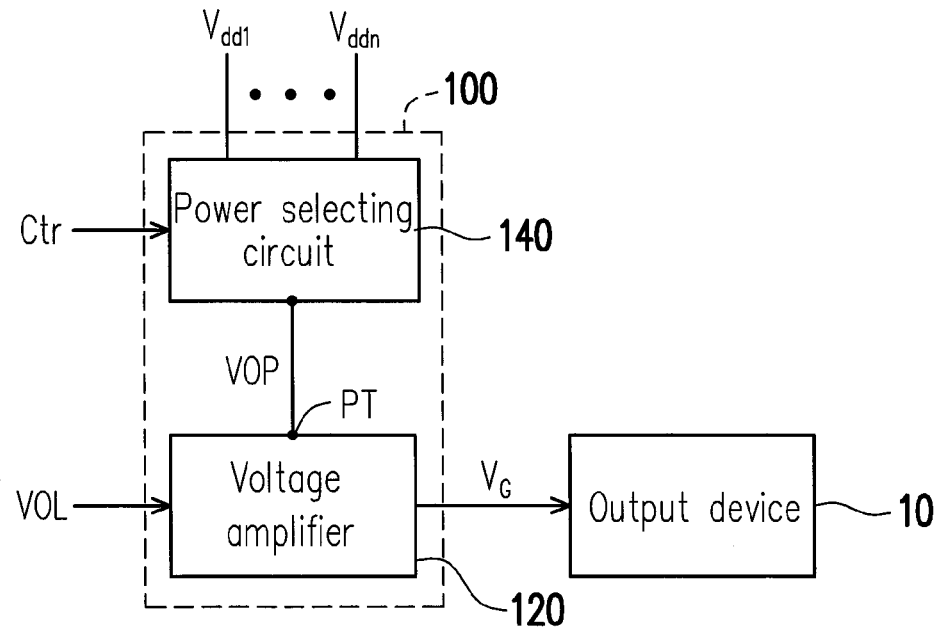
FIG. 1B is a diagram illustrating the operation of the voltage supply circuit 100 according to another embodiment of the disclosure.

Additionally, the power selecting circuit 140 in the disclosure may also be designed to directly receive a control signal Ctr indicating the volume level of the audio signal VOL and supply one of the supply voltages Vdd1-Vddn according to the control signal Ctr. FIG. 1B is a diagram illustrating the operation of the voltage supply circuit 100 according to another embodiment of the disclosure. Referring to FIG. 1B, the power selecting circuit 140 receives the control signal Ctr and supplies one of the supply voltages Vdd1-Vddn to the voltage amplifier 120 according to the control signal Ctr. In the present embodiment, the control signal Ctr received by the power selecting circuit 140 indicates the volume level of the audio signal VOL such that the power selecting circuit 140 can supply one of the supply voltages Vdd1-Vddn accordingly. For example, if the voltage supply circuit 100 is applied to a communication product, a user can directly adjust the volume level of the audio signal VOL through a user interface. In this case, a control signal Ctr is generated inside the communication product and sent to the power selecting circuit 140, and the power selecting circuit 140 supplies one of a plurality of supply voltages Vdd1-Vddn to the voltage amplifier 120 according to the control signal Ctr.

Figure 2:
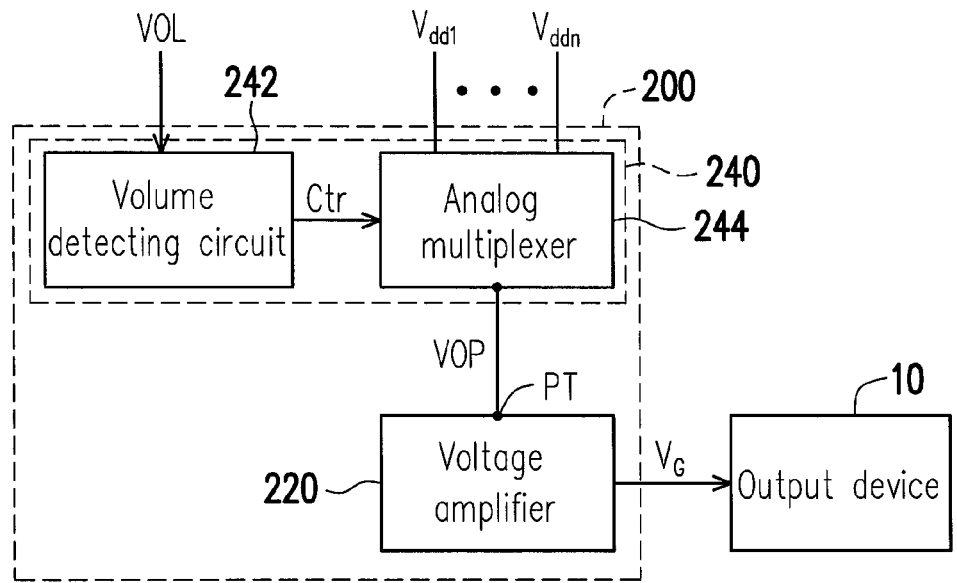
FIG. 2 is a diagram of a voltage supply circuit 200 according to another embodiment of the disclosure.

FIG. 2 is a diagram of a voltage supply circuit 200 according to another embodiment of the disclosure. In the present embodiment, the power selecting circuit 240 of the voltage supply circuit 200 further includes a volume detecting circuit 242 and an analog multiplexer 244. The volume detecting circuit 242 outputs a control signal Ctr according to the volume level of an audio signal VOL. The analog multiplexer 244 in the power selecting circuit 240 is coupled to the volume detecting circuit 242 to receive the control signal Ctr and supply one of the supply voltages Vdd1-Vddn to the power terminal PT of the voltage amplifier 220 according to the control signal Ctr. For example, different voltage levels of the control signal Ctr indicate different selections of the analog multiplexer 244. Assuming that the control signal Ctr is a digital signal, when the control signal Ctr is at a logic high level, the analog multiplexer 244 supplies the supply voltage Vdd1 to the power terminal PT of the voltage amplifier 220, and when the control signal Ctr is at a logic low level, the analog multiplexer 244 supplies the supply voltage Vdd2 to the power terminal PT of the voltage amplifier 220.

However, the control signal Ctr may also be an analog signal, and the analog multiplexer 244 can supply one of the supply voltages Vdd1-Vddn as the operating voltage VOP according to the voltage level of the control signal Ctr. In addition, the control signal Ctr may also be a multi-bit digital signal for indicating the voltage selecting operations of the analog multiplexer 244. To be specific, besides directly receiving the control signal Ctr (for example, the power selecting circuit 140 in FIG. 1B), a power selecting circuit (for example, the power selecting circuit 240 in FIG. 2) may also detect the volume level of the audio signal VOL to generate the control signal Ctr through the volume detecting circuit 242 in the present embodiment.

Figure 3:
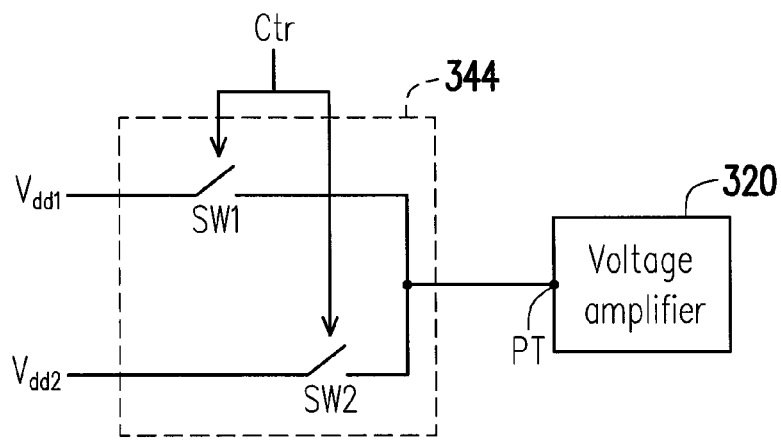
FIG. 3 is a diagram of an analog multiplexer 344 according to an embodiment of the disclosure.

FIG. 3 is a diagram of an analog multiplexer 344 according to an embodiment of the disclosure. Referring to FIG. 3, in the present embodiment, the analog multiplexer 344 includes switches SW1 and SW2. The first terminal of the switch SW1 is coupled to the supply voltage Vdd1, and the first terminal of the switch SW2 is coupled to the supply voltage Vdd2. The control terminals of the switches SW1 and SW2 receive the control signal Ctr, and the switches SW1 and SW2 are turned on or off according to the control signal Ctr. Actually, the switches SW1 and SW2 are never turned on at the same time. It should be noted that the number of switches is not limited to that mentioned above but can be determined according to the number of supply voltages. Besides, the switches are respectively disposed between the supply voltages and the voltage amplifier. By working with different on/off states of the switches, the analog multiplexer 344 can select the desired supply voltage and supply it to the voltage amplifier 320.

Figure 4:
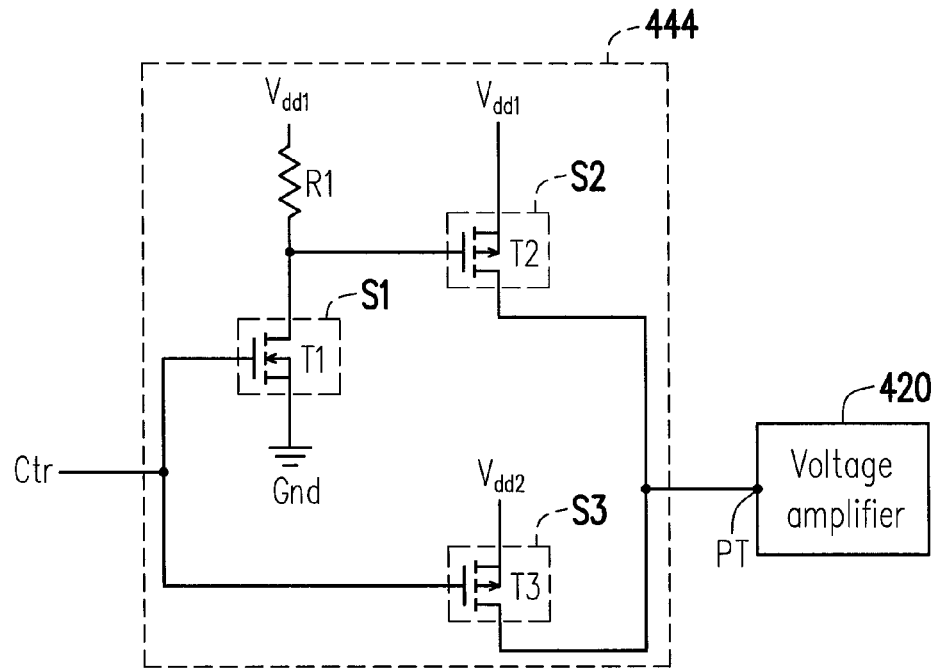
FIG. 4 is a diagram of an analog multiplexer 444 according to an embodiment of the disclosure.

FIG. 4 is a diagram of an analog multiplexer 444 according to an embodiment of the disclosure. Referring to FIG. 4, the analog multiplexer 444 is coupled among the supply voltages Vdd1 and Vdd2 and a voltage amplifier 420.

The analog multiplexer 444 includes a first switch S1, a second switch S2, a third switch S3, and a first resistor R1. The first terminal of the first switch S1 is coupled to the supply voltage Vdd1, and the second terminal of the first switch S1 is coupled to the ground Gnd. The control terminal of the second switch S2 is coupled to the first terminal of the first switch S1, the first terminal of the second switch S2 is coupled to the supply voltage Vdd1, and the second terminal of the second switch S2 is coupled to the power terminal PT of the voltage amplifier 420. The first terminal of the third switch S3 is coupled to the supply voltage Vdd2, and the second terminal of the third switch S3 is coupled to the power terminal PT of the voltage amplifier 420. The first resistor R1 is coupled among the supply voltage Vdd1, the first terminal of the first switch S1, and the control terminal of the second switch S2.

In the present embodiment, the first switch S1 is implemented by using a transistor T1. The transistor T1 is an N-type transistor. The first terminal of the transistor T1 is a drain, the second terminal of the transistor T1 is a source, and the control terminal of the transistor T1 is a gate. The second switch S2 and the third switch S3 are respectively implemented by using a transistor T2 and a transistor T3. The transistors T2 and T3 are P-type transistors. The first terminals of the transistors T2 and T3 are sources, the second terminals thereof are drains, and the control terminals thereof are gates.

When the analog multiplexer 444 is in operation, the control terminals of the first switch S1 and the third switch S3 determine whether to turn on the first switch S1 and the third switch S3 according to the volume level of the audio signal. When the first switch S1 is turned on, the control terminal of the second switch S2 turns on the second switch S2 so that the supply voltage Vdd1 is supplied to the power terminal PT of the voltage amplifier 420 through the second switch S2. Contrarily, when the third switch S3 is turned on, the supply voltage Vdd2 is supplied to the power terminal PT of the voltage amplifier 420 through the third switch S3. It should be noted that through the circuit design and the selection of switch elements, the conditions for turning on the first switch S1 and the third switch S3 are different. Thus, when the first switch S1 and the second switch S2 are turned on, the third switch S3 is turned off, so that the supply voltage Vdd2 cannot be output to the voltage amplifier 420 through the third switch S3. Contrarily, when the third switch S3 is turned on, the first switch S1 is turned off, so that the supply voltage Vdd1 cannot be output to the voltage amplifier 420 through the second switch S2. For example, with the control signal Ctr which indicates the volume level of the audio signal VOL, the switches SW1-SW3 in the analog multiplexer 444 are respectively turned on or off according to the volume level of the audio signal VOL, so that one of the supply voltages Vdd1-Vdd2 is supplied to the voltage amplifier 420.

The analog multiplexer 444 in the embodiment described above can be applied to a voltage supply circuit 400 provided by the disclosure along with the volume detecting circuit 242 illustrated in FIG. 2. Below, an application example will be described with reference to FIG. 2 and FIG. 4. The volume detecting circuit 242 is coupled to the control terminals of the first switch S1 and the third switch S3 and outputs the control signal Ctr. The control signal Ctr is converted by the volume detecting circuit 242 according to the volume level of the audio signal VOL. In the current example, the control signal Ctr is assumed to be at a high voltage level when the voltage level thereof is 3.3V, and the control signal Ctr is assumed to be at a low voltage level when the voltage level thereof is 0V. The analog multiplexer 444 is coupled among the supply voltage Vdd1, the supply voltage Vdd2, the voltage amplifier 420, and the volume detecting circuit 242. The supply voltage Vdd1 and the supply voltage Vdd2 are respectively 5V and 3.3V.

As described above, the first switch S1, the second switch S2, and the third switch S3 are respectively implemented by using transistors T1, T2, and T3. When the control signal Ctr is at the high voltage level (3.3V), because the first terminal of the third switch S3 is coupled to the supply voltage Vdd2 of 3.3V, the third switch S3 is not turned on. The control terminal of the first switch S1 is driven by the control signal Ctr, so that the first switch S1 is turned on, and accordingly the second switch S2 is also turned on. The supply voltage Vdd1 is output to the power terminal PT of the voltage amplifier 420 through the second switch S2. Herein the supply voltage Vdd1 supplied to the voltage amplifier 420 as the operating voltage VOP is 5V. Contrarily, when the control signal Ctr is at the low voltage level (0V), the second terminal of the first switch S1 is connected to the ground Gnd, so that the first switch S1 is turned off. The control terminal of the third switch S3 is driven by the control signal Ctr, so that the third switch S3 is turned on and accordingly the supply voltage Vdd2 is output to the power terminal PT of the voltage amplifier 420 through the third switch S3. Herein the supply voltage Vdd2 supplied to the voltage amplifier 420 as the operating voltage VOP is 3.3V.

Through the operations described above, the control signal Ctr reflects the volume level of the audio signal with different voltage levels, and the analog multiplexer 444 provides one of the supply voltages Vdd1 and Vdd2 to the voltage amplifier 420 according to the voltage level of the control signal Ctr. The embodiment described above is only one of many implementations of the disclosure. According to the design requirement, the analog multiplexer can be coupled between multiple supply voltages and the power terminal of the voltage amplifier and supply one of the multiple supply voltages to the power terminal of the voltage amplifier according to the voltage or logic level of a control signal. Additionally, the analog multiplexer can be applied in a voltage supply circuit by directly replacing the power selecting circuit. In this case, the analog multiplexer can receive a control signal and supply one of a plurality of supply voltages to the voltage amplifier according to the received control signal.

The disclosure also provides an audio output apparatus including the voltage supply circuit described above and a speaker. Taking the embodiment illustrated in FIG. 1 as an example, an audio output apparatus is accomplished by simply implementing the output device 10 in FIG. 1 as a speaker. In the audio output apparatus, the voltage amplifier 120 receives an operation power and outputs a gain voltage $V_G$ to the speaker (i.e., the output device 10) through the power terminal PT, so that the speaker can produce a sound according to the audio signal. The power selecting circuit 140 selects one of the supply voltages according to the volume level of the audio signal VOL and supplies the selected supply voltage to the power terminal PT of the voltage amplifier 120 as the operation power of the voltage amplifier 120. The dispositions of other elements and the operation of the audio output apparatus can be referred to the embodiments described above therefore will not be described herein.

Figure 5:
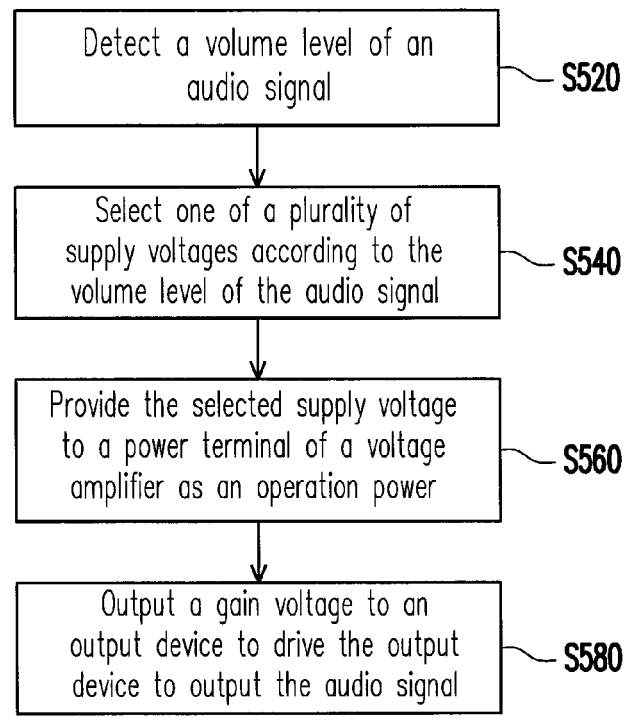
FIG. 5 is a flowchart of a voltage supplying method of an output device according to an embodiment of the disclosure.

FIG. 5 is a flowchart of a voltage supplying method of an output device according to an embodiment of the disclosure. Referring to FIG. 5, in step S520, the volume level of an audio signal is detected. Then, in step S540, one of a plurality of supply voltages is selected according to the detected volume level of the audio signal. In step S560, the selected supply voltage is provided and supplied to the power terminal of a voltage amplifier as an operation power to sustain the operation of the voltage amplifier. In the last step S580, a gain voltage is output to drive the output device to output the audio signal.

The operation details regarding the selection of the operating voltage of a voltage amplifier according to the volume level of an audio signal have been explained in foregoing embodiments and examples therefore will not be described herein.

As described above, according to an embodiment of the disclosure, a voltage supply circuit supplies one of a plurality of supply voltages to the power terminal of a voltage amplifier through a power selecting circuit according to the volume level of an audio signal. Through such a design, the supply voltage outputted by the voltage supply circuit can be adjusted according to the volume level of the audio signal, so that the power consumption is reduced without affecting the output quality of the output device.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A voltage supply circuit, comprising:
   a voltage amplifier, having a power terminal, wherein the voltage amplifier receives an operation power and outputs a gain voltage to drive an output device through the power terminal; and
   a power selecting circuit, receiving a plurality of supply voltages, wherein the power selecting circuit selects one of the supply voltages according to a volume level of an audio signal and supplies the selected supply voltage to the power terminal of the voltage amplifier as the operation power, wherein the power selecting circuit comprises:
   a volume detecting circuit, wherein the volume detecting circuit outputs a control signal according to the volume level of the audio signal; and
   an analog multiplexer, coupled to the supply voltages and the volume detecting circuit, wherein the analog multiplexer receives the control signal from the volume detecting circuit and supplies one of the supply voltages to the voltage amplifier according to the control signal.

2. The voltage supply circuit according to claim 1, wherein the power selecting circuit sets a plurality of volume groups, and the power selecting circuit supplies the operation power to the voltage amplifier according to one of the volume groups corresponding to the volume level of the audio signal.

3. The voltage supply circuit according to claim 1, wherein when the control signal is at a first voltage level, the analog multiplexer selects a first supply among the supply voltages and supplies the first supply voltage to the power terminal of the voltage amplifier, and when the control signal is at a second voltage level, the analog multiplexer selects a second supply voltage among the supply voltages which is different from the first supply voltage and supplies the second supply voltage to the power terminal of the voltage amplifier.

4. The voltage supply circuit according to claim 1, wherein the analog multiplexer comprises:
- a plurality of switches, wherein first terminals of the switches are respectively coupled to the supply voltages, second terminals of the switches are coupled to the power terminal of the voltage amplifier, and control terminals of the switches respectively turn on or off the switches according to the volume level of the audio signal,
- so as to allow the analog multiplexer to supply one of the supply voltages to the power terminal of the voltage amplifier.

5. The voltage supply circuit according to claim 1, wherein the supply voltages comprise a first supply voltage and a second supply voltage, the first supply voltage is greater than the second supply voltage, and the analog multiplexer comprises:
- a first switch, having a first terminal coupled to the first supply voltage and a second terminal coupled to a ground;
- a second switch, having a control terminal coupled to the first terminal of the First switch, a first terminal coupled to the first supply voltage, and a second terminal coupled to the power terminal of the voltage amplifier;
- a third switch, having a first terminal coupled to the second supply voltage and a second terminal coupled to the power terminal of the voltage amplifier; and
- a first resistor, coupled among the first supply voltage, the first terminal of the first switch, and the control terminal of the second switch,
- wherein control terminals of the first switch and the third switch respectively turn on or off the first switch and the third switch according to the volume level of the audio signal, so as to allow the analog multiplexer to selectively supply the first supply voltage or the second supply voltage to the power terminal of the voltage amplifier.

6. The voltage supply circuit according to claim 5, wherein the first switch is an N-type transistor, and the second switch and the third switch are P-type transistors.

7. The voltage supply circuit according to claim 1, wherein the output device is a speaker.

8. An audio output apparatus, comprising:
- a voltage supply circuit, comprising:
- a voltage amplifier, having a power terminal, wherein the voltage amplifier receives an operation power and outputs a gain voltage through the power terminal; and
- a power selecting circuit, receiving a plurality of supply voltages,
- wherein the power selecting circuit selects one of the supply voltages according to a volume level of an audio signal and supplies the selected supply voltage to the power terminal of the voltage amplifier as the operation power; and
- a speaker, coupled to the voltage amplifier, wherein the speaker receives the gain voltage and outputs the audio signal, wherein the power selecting circuit comprises:
- a volume detecting circuit, wherein the volume detecting circuit outputs a control signal according to the volume level of the audio signal; and
- an analog multiplexer, coupled to the supply voltages and the volume detecting circuit, wherein the analog multiplexer receives the control signal from the volume detecting circuit and supplies one of the supply voltages to the voltage amplifier according to the control signal.

9. The audio output apparatus according to claim 8, wherein the power selecting circuit sets a plurality of volume groups, and the power selecting circuit supplies the operation power to the voltage amplifier according to one of the volume groups corresponding to the volume level of the audio signal.

10. The audio output apparatus according to claim 8, wherein when the control signal is at a first voltage level, the analog multiplexer selects a first supply voltage among the supply voltages and supplies the first supply voltage to the power terminal of the voltage amplifier, and when the control signal is at a second voltage level, the analog multiplexer selects a second supply voltage among the supply voltages which is different from the first supply voltage and supplies the second supply voltage to the power terminal of the voltage amplifier.

11. The audio output apparatus according to claim 8, wherein the analog multiplexer comprises:
- a plurality of switches, wherein first terminals of the switches are respectively coupled to the supply voltages, second terminals of the switches are coupled to the power terminal of the voltage amplifier, and control terminals of the switches respectively turn on or off the switches according to the volume level of the audio signal, so as to allow the analog multiplexer to supply one of the supply voltages to the power terminal of the voltage amplifier.

12. The audio output apparatus according to claim 8, wherein the supply voltages comprise a first supply voltage and a second supply voltage, the first supply voltage is greater than the second supply voltage, and the analog multiplexer comprises:
- a first switch, having a first terminal coupled to the first supply voltage and a second terminal coupled to a ground;
- a second switch, having a control terminal coupled to the first terminal of the first switch, a first terminal coupled to the first supply voltage, and a second terminal coupled to the power terminal of the voltage amplifier;
- a third switch, having a first terminal coupled to the second supply voltage and a second terminal coupled to the power terminal of the voltage amplifier; and
- a first resistor, coupled among the first supply voltage, the first terminal of the first switch, and the control terminal of the second switch,
- wherein control terminals of the first switch and the third switch respectively turn on or off the first switch and the third switch according to the volume level of the audio signal, so as to allow the analog multiplexer to selectively supply the first supply voltage or the second supply voltage to the power terminal of the voltage amplifier.

13. The audio output apparatus according to claim 12, wherein the first switch is an N-type transistor, and the second switch and the third switch are P-type transistors.

14. A voltage supplying method of an output device, comprising:
- detecting a volume level of an audio signal;
- selecting one of a plurality of supply voltages according to the volume level of the audio signal;
- supplying the selected supply voltage to a power terminal of a voltage Amplifier as an operation power;
- outputting a gain voltage to the output device to drive the output device to Output the audio signal;
- outputting a control signal according to the volume level of the audio signal;
- and supplying one of the supply voltages to the power terminal of the voltage amplifier according to the control signal.

15. The voltage supplying method according to claim 14 further comprising:

outputting a control signal according to the volume level of the audio signal; and supplying one of the supply voltages to the power terminal of the voltage amplifier according to the control signal.

\* \* \* \* \*